United States Patent
Hack

(10) Patent No.: US 7,865,882 B2
(45) Date of Patent: Jan. 4, 2011

(54) FAST CORRECTLY ROUNDING FLOATING POINT CONVERSION AND IDENTIFYING EXCEPTIONAL CONVERSION

(75) Inventor: Michel Henri Theodore Hack, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 1174 days.

(21) Appl. No.: 11/506,717

(22) Filed: Aug. 18, 2006

(65) Prior Publication Data

US 2008/0065709 A1 Mar. 13, 2008

(51) Int. Cl.
*G06F 9/44* (2006.01)
*G06F 9/45* (2006.01)

(52) U.S. Cl. .................. 717/127; 717/128; 717/129

(58) Field of Classification Search .......... 717/124–131
See application file for complete search history.

(56) References Cited

U.S. PATENT DOCUMENTS

| | | | | |
|---|---|---|---|---|
| 3,968,471 | A * | 7/1976 | Savit | 367/39 |
| 5,317,740 | A * | 5/1994 | Sites | 717/129 |
| 5,687,359 | A * | 11/1997 | Smith, Sr. | 712/222 |
| 5,842,017 | A * | 11/1998 | Hookway et al. | 717/158 |
| 5,867,712 | A * | 2/1999 | Shaw et al. | 717/127 |
| 5,889,980 | A * | 3/1999 | Smith, Jr. | 712/222 |
| 6,049,669 | A * | 4/2000 | Holler | 717/160 |
| 6,126,329 | A * | 10/2000 | Bennett et al. | 717/127 |
| 6,161,219 | A * | 12/2000 | Ramkumar et al. | 717/130 |
| 6,247,113 | B1 * | 6/2001 | Jaggar | 712/200 |
| 6,304,963 | B1 * | 10/2001 | Elwood | 712/244 |
| 6,332,186 | B1 * | 12/2001 | Elwood et al. | 711/217 |
| 6,550,057 | B1 * | 4/2003 | Bowman-Amuah | 717/126 |
| 6,634,019 | B1 * | 10/2003 | Rice et al. | 717/127 |
| 6,941,545 | B1 * | 9/2005 | Reese et al. | 717/130 |
| 7,162,716 | B2 * | 1/2007 | Glanville et al. | 717/151 |
| 7,216,138 | B2 * | 5/2007 | Abdallah et al. | 708/204 |
| 7,236,995 | B2 * | 6/2007 | Hinds | 708/204 |
| 7,694,274 | B2 * | 4/2010 | Meijer et al. | 717/114 |

OTHER PUBLICATIONS

Oh et al, "A fully pipeliined single precision floating point unit in the synergistic processor element of a CELL processor", IEEE, pp. 759-771, 2006.*

Evangelista, "Roundoff noise analysis in digital system for arbitrary sampling rate conversion", IEEE, pp. 1016-1023, 2003.*

Fousse et al, "MPFR: A multiple precision binary floating point library with correct rounding", ACM Trans. on Mathematical Software, vol. 33, No. 2, article 13, pp. 1-15, 2007.*

Cornea et al, "Intel itanium floating point architecture", ACM WCAE, pp. 1-9, 2003.*

(Continued)

*Primary Examiner*—Anil Khatri
(74) *Attorney, Agent, or Firm*—Tutunjian & Bitetto, P.C; William J. Stock

(57) ABSTRACT

A system and method for converting bases of floating point numbers with improved rounding over an entire exponent range includes identifying exceptional conversions for a given source precision to target precision. A representation of the exceptions is stored in a bit vector for use during conversion execution.

18 Claims, 3 Drawing Sheets

OTHER PUBLICATIONS

Abbott, et al., Architecture and software support in IBM S/390 Parallel Enterprise Servers for IEEE Floating-Point arithmetic, IBM Journal of Research and Development, vol. 43, No. 5/6, pp. 723-760, Sep./Nov. 1999.

William D. Clinger, How to Read Floating Point Numbers Accurately, Proceedings of the ACM SIGPLAN '90 Conference on Programming Language Design and Implementation., pp. 92-101, Jun. 20-22, 1990.

Steele, et al., How to Print Floating Point Numbers Accurately, Proceedings of the ACM SIGPLAN '90 Conference on Programming Language Design and Implementation., pp. 112-126, Jun. 20-22, 1990.

Gordon Slishman, Fast and Perfectly Rounding Decimal/Hexadecimal Conversions, IBM Research Report RC 15683, pp. 1-11, 1990.

Michel Hack, "On Intermediate Precision Required for Correctly-Rounding Decimal-to-Binary Floating-Point Conversion", RNC6 (Real Numbers and Computers 6), Nov. 2004, Dagstuhl, Germany, pp. 113-134.

* cited by examiner

FAST CORRECTLY ROUNDING FLOATING POINT CONVERSION AND IDENTIFYING EXCEPTIONAL CONVERSION

BACKGROUND

1. Technical Field

The present invention relates to floating point conversion systems and methods and more particularly to efficient and accurate floating point conversions.

2. Description of the Related Art

There are several ways to represent real numbers. For example on computers, fixed point places a radix point somewhere in the middle of the digits, and is equivalent to using integers that represent portions of some unit. For example, if four decimal digits are available, you could represent a number by 10.82, or 00.01. Another approach is to use rationals, and represent every number as the ratio of two integers.

Floating-point representation is the most common solution and basically represents real numbers in scientific notation. Scientific notation represents numbers as a base number and an exponent. For example, 123.456 could be represented as $1.23456 \times 10^2$. In hexadecimal, the number 123.abc might be represented as $1.23abc \times 16^2$.

Floating-point solves a number of representation problems, while fixed-point has a fixed window of representation, which limits it from representing very large or very small numbers. Also, fixed-point is prone to a loss of precision during multiplication or division.

Floating-point, on the other hand, employs a sort of "sliding window" of precision appropriate to the scale of the number. This easily permits the representation of both very large and very small numbers.

Correctly-rounding floating-point conversion from one radix to another needs an intermediate precision that is typically more than double the desired target precision, if a correctly-rounded result is needed. Until about ten years ago most programming environments only guaranteed a reasonably-bounded conversion error, e.g., one unit in the last place (one "ulp"), which can be achieved by a few simple multiplications in a target precision.

Correct rounding would be achieved by resorting to multiple-precision arithmetic, sometimes unconditionally, sometimes only for "difficult" numbers when an error analysis showed that the result was dangerously close to a rounding threshold. The cost of this extra mechanism would be several times that of a simple conversion, and would often require large amounts of scratch storage to hold extended-precision intermediate results.

SUMMARY

A system and method for converting bases of floating point numbers with improved rounding over an entire exponent range includes identifying exceptional conversions for a given source precision to target precision. A representation of the exceptions is stored in a bit vector for use during conversion execution.

A system for converting bases of floating point numbers with improved rounding over an entire exponent range includes a processing module configured to perform floating point conversion operations. A bit vector is stored in memory configured to store identified exceptional conversions for a given source precision to a target precision to correctly round results of the conversion operations when the identified exceptional conversions are encountered.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
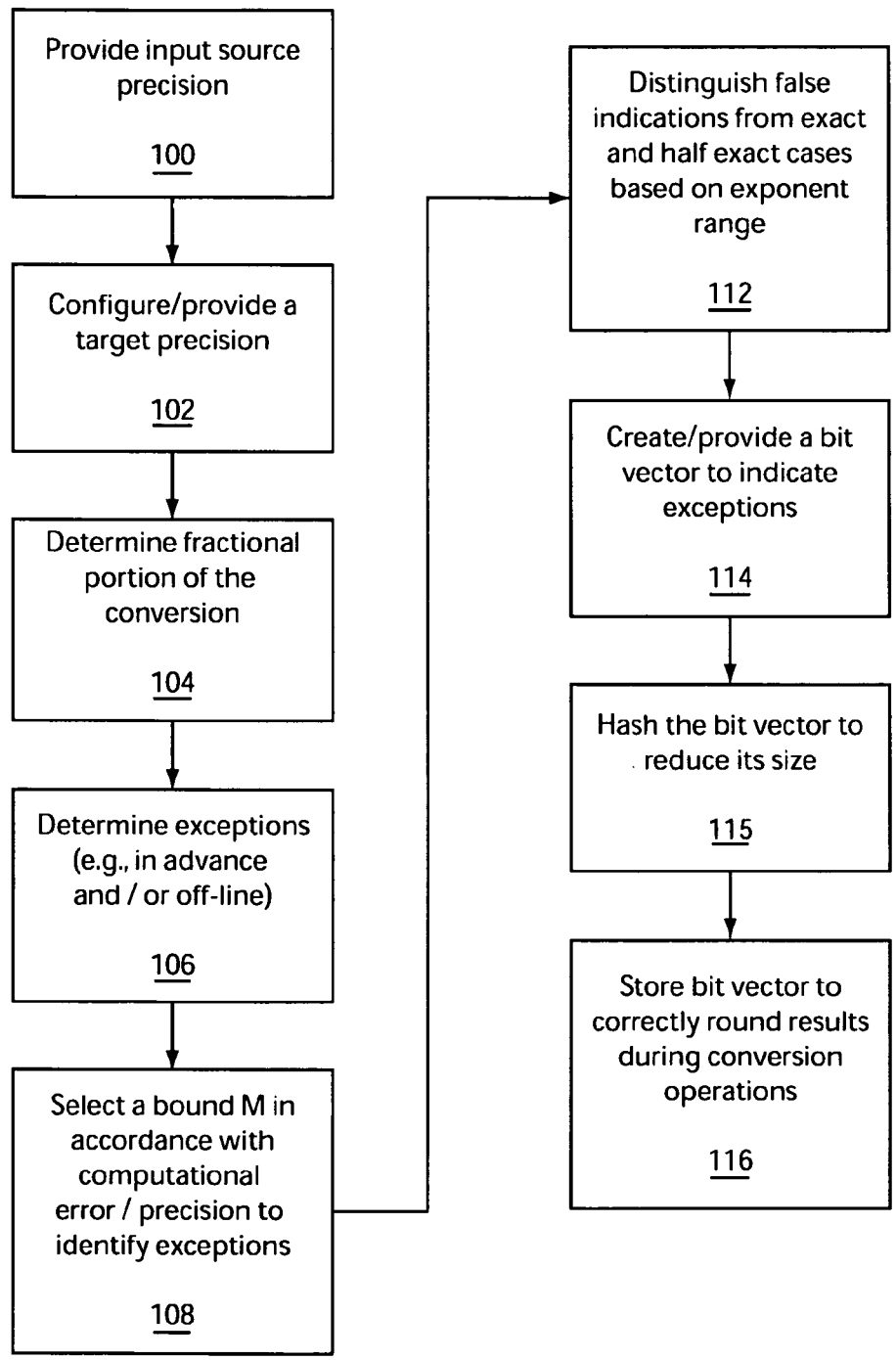
FIG. 1 is block/flow diagram showing a source to target conversion method and system in accordance with the present principles.

Methods and systems disclosed herein provide fast floating-point conversion with less intermediate precision needed than previous methods. Advantageously, in accordance with present principles, the sufficiently less intermediate precision permits exploitation of machine extended-precision format (e.g., BFP128), and in one important case of IEEE Double (or simply Double) to Decimal17 conversion, without compromising correct rounding across an entire exponent range.

The systems and methods presented herein also employ significantly less intermediate scratch storage than previous methods since less intermediate precision is needed. The present principles are applicable to a plurality of platforms and/or processor designs. For example, e-server platforms, and may be used in the implementation of conversion instruction set for a plurality of applications.

Embodiments of the present invention can take the form of an entirely hardware embodiment, an entirely software embodiment or an embodiment including both hardware and software elements. In a preferred embodiment, the present invention is implemented in hardware; however software embodiments may include but are not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that may include, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

A data processing system suitable for storing and/or executing program code may include at least one processor coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The methods and systems may be implemented on or as part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Floating-point computations are generally not exact, meaning that the mathematical value of the result is not exactly equal to the infinitely precise result based on the mathematical value of the inputs. Each input does have a precise mathematical value: it is the product of an integer times a positive or negative power of the base, and hence a rational number. The product of two three-digit numbers can however have up to six digits, so if the floating-point format is limited to three digits, the exact result will have to be rounded to three digits. This single rounding can however be described precisely: the result is one of the two three-digit rounded numbers that bracket the exact result. To give a simple example, 1.23 times 2.34 is 2.8782 exactly, and the two bounding three-digit numbers are 2.87 and 2.88. The rounding rule will pick one (e.g. 2.88 for round-to-nearest). The rule also specifies what to do in case of a tie, e.g. 1.25*2.34 is 2.9250 which is exactly between the two bounding three-digit numbers 2.92 and 2.93. The IEEE "half-even" rule would pick the even one, 2.92; school rounding ("half-up") would pick the larger one, 2.93. This describes a single operation, in this case multiplication.

A complex operation like base conversion usually involves multiple steps, but it too can be defined to produce an "infinitely precise" mathematical result, which is then rounded to a correctly-rounded result in the same way as described for a single operation. One key point is the single rounding step. In practice, we do not compute with "infinite" precision, so we produce an intermediary result that has higher precision than the desired final result (e.g. multiplication produces an intermediate result that has up to twice the precision of the final result). In a multiple-step operation, the maximum possible intermediate rounding error can be tracked (when not using infinite precision). If the last intermediate result is sufficiently far from a rounding threshold (e.g., the midpoint between two final-precision numbers, for round-to-nearest) so that the worst intermediate rounding error could not cross the rounding threshold, then rounding correctly is easy. For example, compute an intermediary result of 2.877, and the maximum error is 0.001, then the true value is anywhere between 2.876 and 2.878—but both would round up to 2.88, because 2.877 was sufficiently far from the rounding threshold of 2.8750 (the final precision is three digits in the example).

In base conversions, to go from $B*2**b$ to $D*10d$ B is multiplied by $r=2b/10**d$. The decimal exponent d can be found from the binary exponent b by observing that B and D each have a narrow range, frequently overlapping in value, so that d is roughly 3.3 times b (taking logarithms). Various techniques known in the art determine this multiplier r, and usually a floating-point or other approximation of r is employed instead of the exact rational value, and also more than one multiplication may be used (to cut down on the number of precomputed multipliers that may be stored in some table), so this operation is carried out with some intermediate precision that is higher than the desired final precision.

Traditional methods pick an intermediate precision that makes the proportion of near-threshold intermediate results small. For example, if the intermediate precision has two more digits than the final one, roughly 98% of the intermediate results will be more than 1% away from the rounding threshold, and can be rounded directly. For the unlucky 2%, it will be necessary to retry with higher precision (at significant cost in performance), until it is known reliably on which side of the threshold the result falls.

In newer methods, e.g., Michel Hack in "On Intermediate Precision Required for Correctly-Rounding Decimal-to-Binary Floating Point Conversion", Real Numbers and Computers'6, 113-134, Dagstuhl Germany, November 2004, incorporated herein by reference, an intermediate precision is selected which is guaranteed to avoid ambiguous intermediate results. When the intermediate result is very close to the threshold, it is known that the exact result is an exact half-way point, so tie-breaking rules are invoked. Otherwise, it is known which way to round directly. A bound L is defined in the above-referenced paper, which is referred to below.

In accordance with the present principles, an intermediate precision is selected that is not quite as high as that of the preceding method, using a bound M larger than L in accordance with present principles. When the intermediate result is closer than M to the rounding threshold, an exact midpoint may have been found as above, or a "false exact" case has been found. If the intermediate result is more than M away from the rounding threshold, direct rounding is performed. "False exact" from "true exact" cases need to be distinguished.

For a range of intermediate precisions smaller than the minimum needed for exceptionless correctly-rounding conversions, the number of exceptions (e.g., "false exact" from "true exact" cases) is small. The exceptions can be precomputed (e.g., in advance and/or off-line), and exceptions can be recognized efficiently as a side-effect of the rounding mechanism, so that there is no need to compare the input to a list of exceptions. Correctly-rounding floating-point conversion from one radix to another (e.g., binary-to-decimal) in accordance with present principles preferably employs an intermediate precision that is the sum of source and target precisions (both expressed in bits), plus a constant that is derived via Continued Fraction (CF) theory from the target precision and the exponent range to be covered.

In one illustrative example, IEEE Double has a precision of 53 bits. In this case this is the source precision (for binary). Decimal17 has a precision ceiling of $(17*\log_2(10))=57$ bits. This is the target precision (decimal). The Continued-Fraction constant is 9, leading to a requirement for 119 bits (53+57+9=119). 17 decimal digits are required to support unambiguous round-trip conversion from binary to decimal and back to binary, which is why this is a practically important precision. IEEE Double is currently the most common floating-point format.

In one illustrative case, a machine extended-precision format has a precision of 113 bits, which is not enough to support correctly-rounding conversion by the usual methods without resorting to multiple-precision arithmetic since 113 is less than 119.

Conventional methods multiply a given number by an appropriate power of ten to generate a fixed-point number whose integral part has the target precision, and whose fraction is far enough from a rounding threshold for this integral part to be the correct result significand. If the fraction is too close to the rounding threshold, the computation is repeated using higher-precision arithmetic via software subroutines rather than direct machine instructions. This fixed point number includes intermediate results.

A method in accordance with the present principles employs the fact that the number of cases (exceptions) is small where an intermediate precision that does not take the Continued Fraction term into account rounds the wrong way. These cases are advantageously precomputable and easy to recognize. Only one bit of information per case is needed, namely whether that number is above or below the rounding threshold.

In the case of IEEE Double to Decimal17 conversion by means of BFP128, with the default rounding mode of round-to-nearest with ties broken to even (IEEE Half-Even rounding), there are only 23 exceptional cases, of which 12 would round the wrong way if not corrected by this new method.

A Decimal Floating-Point (DFP) feature of one architecture may include a Decimal16 format (DFP64), whose correct-rounding precision requirement is just one more bit (114 bits) than machine precision of BFP128 (113 bits), and there are indeed only two exceptional cases to be recognized. This feature may include a machine instruction to perform conversions. The millicode for this feature may be able to employ the present principles to great benefit.

Figure 3:
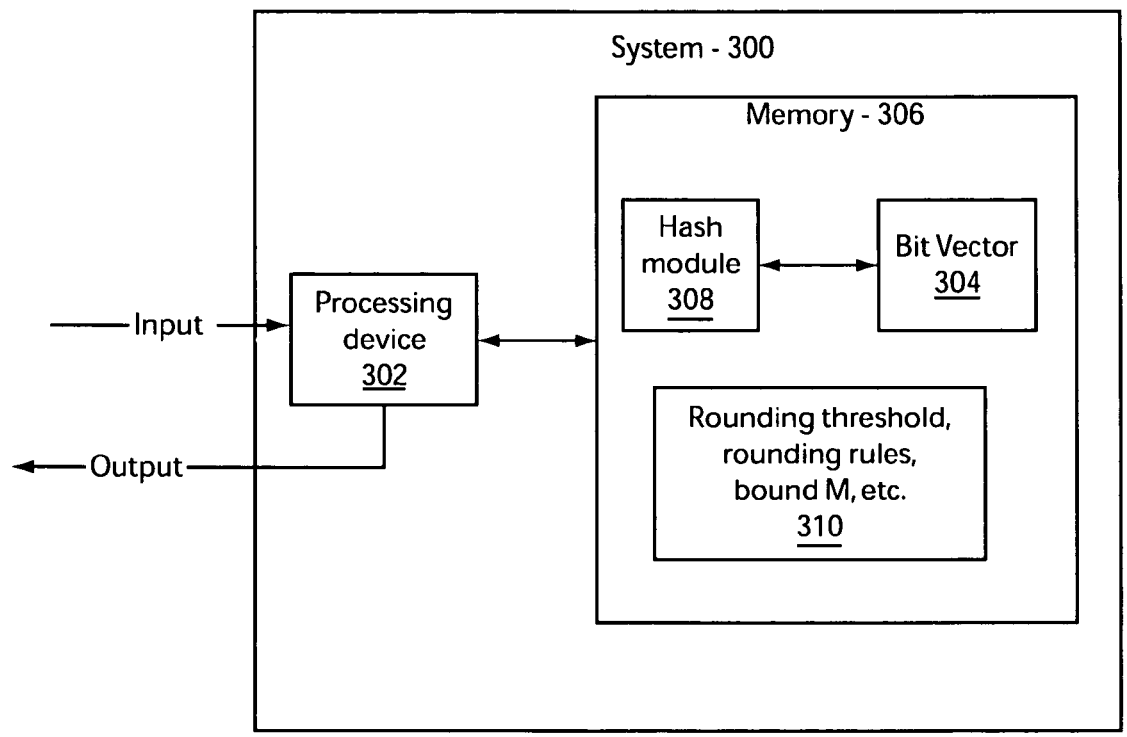
FIG. 3 is a block diagram showing a system for performing conversion operations in accordance with the present principles.

The present principles will now be described in greater detail. Present embodiments may be thought to include an off-line precomputation phase (FIG. 1) and a conversion phase (FIG. 3). In the precomputation phase, the exceptions in the base conversion calculations are determined and preferably stored in a bit vector. The bit vector is then employed during the conversion computations in the conversion phase (FIG. 3).

Referring now to the drawings in which like numerals represent the same or similar elements and initially to FIG. 1, a precomputation phase for an infinite-precision conversion system/method for a binary floating-point number to a decimal floating point number will illustratively be described. Conversion of any other source and target base combination may also be implemented in accordance with the present principles. For purposes of illustration binary and decimal bases will be employed. Also note that ** denotes an exponential operation, * denotes multiplication, and / denotes division.

In block 100, a binary input (source) is provided in the form of: $B*2b$ where B is a p-bit number (e.g., p=53 (source precision)). In block 102**, an output (target) is configured in the form of: $D*10**d$ where D is a q-digit number (e.g., q=17 (target precision)) with: $(D+F)*10**d=B*2b$ (EQ. 1) where $-1/2 \leq F \leq +1/2$. Here F is a fraction, and is the difference between the returned significand D (an integer) and the infinitely precise result. In block 104**, F may be computed to determine exceptions on a plurality of test cases.

In block 106, exceptions are determined in the test cases, e.g., exact solution or half-way results. For example, if F=0, (no fractional part), the conversion is exact. If |F|=1/2, there is a tie to be broken, and a rounding rule decides which way to round an exact half-way result. The rounding rule may be e.g., round up for F=½. In practice, computation is carried out with limited precision, possibly both in the multiplications involved in EQ. 1, and in the chosen internal representation (intermediate results) of the multipliers (in this case, binary representations of selected powers of ten). The result is a fixed-point number U+V where U is the integer part, and $|V| \leq 1/2$ is the fraction part, such that: U+V+e=D+F (where e is the computation error).

It can be shown that there is a bound L such that |e|<L guarantees that the sign of F will be the same as the sign of V, and that exact and half-exact cases can be identified reliably: if |V|<L/2 then F=0, and if (1/2−|V|)<L/2 then |F|=1/2. This bound is where Continued Fraction theory is involved.

In block 108, according to present principles, a larger bound, M may be employed. M>L is employed such that |e|<M guarantees that the only cases where the signs of F and V differ are "difficult" or "near-difficult" numbers for which V=0 or |V|=1/2, i.e. false indications of exactness or half-exactness. In this context, "difficult" numbers are such that B/D is a Continued Fraction Partial Convergent of the rational factor $10d/2b$ used to derive U+V from B, and "near difficult" numbers are Intermediate Convergents (also Best Approximations, obtained by taking mediants of Partial Convergents) of the factor, known in the art. Continued Fraction concepts are also known in the art.

Briefly, a Continued Fraction (CF) development of a number includes separating an integer part from a fraction part, and then taking the inverse of a non-zero fraction part, which will be a new number that exceeds one, and hence has a non-zero integer part and a new fraction. This process is repeated until the fraction part is zero, or until enough "partial quotients" have been computed. The partial quotients are the successive integers extracted in the process described above. So the original number x is equal to $a_0+1/(a_1+1/(a_2+ \ldots )))$ where the $a_i$'s are the successive partial quotients. If we evaluate that expression up to the nth partial quotient, we get the nth Continued Fraction approximation, called the nth Partial Convergent. These are rational numbers P/Q that get closer and closer to x.

Partial Convergents are the best rational approximations of the original value x in the sense that any rational approximation with a smaller denominator will necessarily be worse. A mediant between two rational numbers P/Q and R/S is a rational number of the form (P+kR)/(Q+kS) for some positive integer k, and it can be seen that these are all between P/Q and R/S in value. If P/Q and R/S are two successive Partial Convergents of the CF expansion of x, then they bracket x (one is bigger, the other is smaller), and among the mediants is in fact the next Partial Convergent, for k=$a_{(n+1)}$. The other mediants are also good approximations, better than the previous Partial Convergent but not as good as the next one, and so they provide another source of "near difficult" numbers. Rational approximations that are neither Partial Convergents nor mediants are so far off that they constitute "easy" numbers whose conversion requires no more precision than the absolute minimum, the sum of the source and target precisions plus the computational error of one or two bits.

In block 112, the false exactness indications can be distinguished reliably from true exact or half-way points, because the exponent range in which the former occurs does not include the rather limited exponent range in which exact or half-exact conversions are possible. Moreover, in block 114, a bit vector may be created. The exponent for which a false exactness indication is seen can be used as an index into a bit vector that holds the true sign of F for this case. In block 115, index reduction may be performed. There may be a trivial hash provided that actually reduces this index to much less than the exponent range, e.g., 64 instead of 2048 in the case of IEEE Double. High performance of the present method comes from the fact that the recognition of exceptional cases lies on an infrequent path, where special handling (checking rounding ties) is already necessary, so there is essentially no performance impact over a solution that does not bother to round correctly in all cases.

In the offline procedure of FIG. 1, the bit vector is created, and an actual conversion operation employing the bit vector as will be described in FIG. 3 is performed. The use of the bit vector depends on the distribution of the exceptions. For example, a computed exponent (in the range −308 to +308, as illustratively depicted in FIG. 2) can be hashed as follows: first add 310 (range is now 2 to 618), then divide by 8 and discard the remainder (range 0 to 77). A bit vector of 80 bits (10 bytes) is then enough to encode the exceptions, because in this case no round-up and round-down cases fall into the same "bucket" (bit location). If the round-up and round-down cases did, a different hash would have to be used.

The performance impact can be derived from the description given above. For a particular rounding mode (e.g. "to nearest"), only one of the two "difficulty indicators" V=0 or |V|=1/2 applies (in the "to nearest" case,=1/2). Statistically the vast majority of cases will see |V| not exactly equal to 1/2, and they need no special action. Only when |V|=1/2 (the "possible half exact" case) is further checking needed. The exponent can be hashed into a small value that can be checked to fall into the small "true half-exact" range (in which case the half-exact rounding rule applies), and if not in this range, the small value index into the bit vector is used to decide whether to round up or down to a non-exact result. The code for true half-exact handling should be present in any implementation of correctly-rounding conversion, so the extra burden is simply that exponent test to distinguish true from false half-exact indications, on a path that is rarely taken.

Storage overhead is advantageously reduced because of the compact encoding of the exceptions into a hashed bit vector of just, e.g., a few dozen bits. The number of exceptional cases grows with M relative to L, and a practical choice is selected in block 108 as one where M reflects some natural precision boundary, such as machine precision (the ideal case), or an exact multiple of "limb" precision in a multiple-precision software approach, subject to keeping the number of exceptions manageable (and the exponent range of the exceptions disjoint from that of the true exact or half-exact cases).

The bound M that is larger than L, may include an intermediate precision which is chosen in advance to exploit certain properties (e.g. available machine extended-precision), if such a precision is reasonably close to the precision that was used in Continued Fraction theory then M provides a list of hundreds or perhaps thousands of test numbers that are likely to trigger false-exact cases. These false-exact numbers are known with much higher precision, so the rounding direction is known, and is recorded together with these "exception" numbers in the bit vector. The present principles are particularly useful when the total number of exceptions is reasonable, and the corresponding exponents are well separated (e.g., they don't overlap the range where true exact cases occur).

The exceptional cases can be computed off-line by running the method against a complete set of difficult or near-difficult numbers for the format combination under consideration, and checking those that trigger a false exactness or half-exactness condition.

For a fixed pair of source/target precisions, this is a manageable number of test cases. For IEEE Double to Decimal17, there are 200 difficult numbers, and a little over 2000 near-difficult numbers, and Continued Fraction theory provides the means to find all of those test cases.

The present principles may also be employed for decimal-to-binary conversion. The principles are the same as for binary-to-decimal conversion as described above. In practice the decimal input precision is going to be higher than the 17 digits for which "a sweet spot" has been identified above, but in the special case of machine format conversions between DFP (Decimal Floating Point) and BFP (Binary FP), the decimal precision is fixed, and for Double is in fact Decimal16, a case where there are even fewer exceptional cases than for Decimal17. The machine precision of 113 bits is just at the edge of the number needed for exceptionless conversions (e.g., 114 bits), and indeed in one test implementation there were just two cases, both "difficult" with a large Continued Fraction (CF) Partial Quotient, and there is no need to consider near-difficult numbers.

In block 116, the bit vector or hashed bit vector is stored for use to indicate where exceptions exist in the exponent range during conversion operations as will be described with reference to FIG. 3. The bit vector is used to reference when exceptions occur and what action is needed when the exception occurs (see e.g., FIG. 3).

Figure 2:
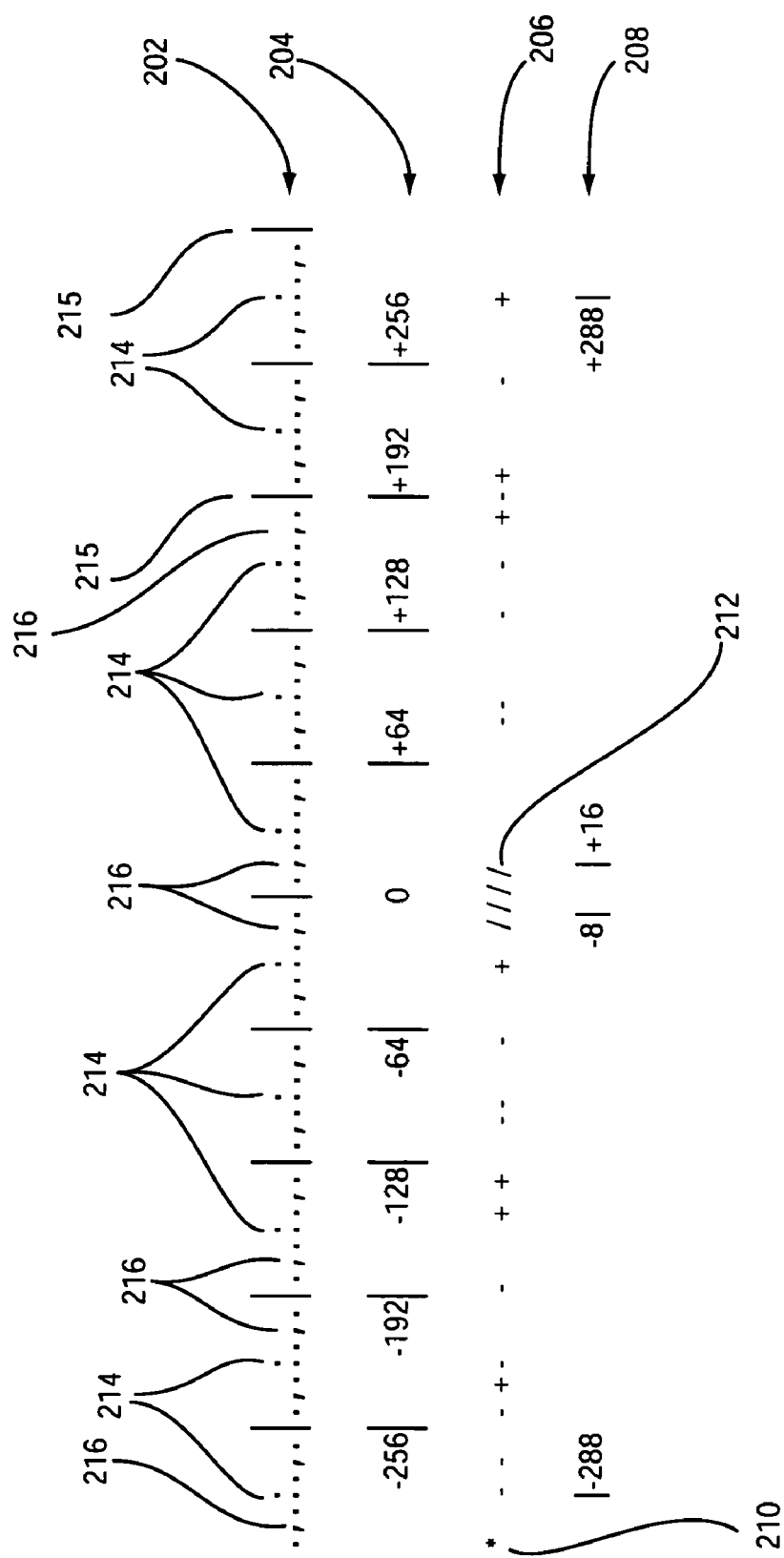
FIG. 2 is a diagram showing a distribution of exceptions for illustrative purposes which may be stored in a bit vector in accordance with the present principles.

Referring to FIG. 2, an illustrative example depicts a distribution of exceptional cases in performing floating point conversions in accordance with present principles. The distribution indicated may be employed in a bit vector. A distribution 206 of exceptional cases along an exponent axis 202, illustrates the following: (1) that exceptions are well outside the range where genuine exact and half-exact cases fall, and (2) the exceptions are well separated, so that a simple hash of the exponent can pick out the appropriate rounding direction.

A central line 206 (starting with '*' 210) shows exceptions (or exception groups) with an exponent resolution of 8: "+" means the apparent half-exact should be rounded up, and "−" means the apparent half-exact should be rounded down. The exceptions may be included in a bit vector to assist in performing conversions. Slashes 212 denote a region (e.g., between −7 to +13) where genuine ("true") exact and half-exact cases may occur.

The vertical bars mark numbered positions. First line 202 has a vertical bar 215 for every multiple of 64, a colon 214 for every odd multiple of 32, and a comma 216 for every multiple of 16. Vertical bars 215 are also used to relate positions on one line to the other, and are labeled using line 204. The exponent range is from −308 to +308; this is the decimal exponent, i.e. the power of ten that scales the floating-point numbers, whose magnitude (in scientific notation) ranges from roughly 2e−308 to 2e+308 for normal double-precision numbers.

Referring to FIG. 3, a system or method 300 is illustratively shown for carrying out conversion operations and/or for creating a bit vector. It should be understood that any processor or software system may be employed to carry out the conversion operations in accordance with the present principles. System 300 converts floating point numbers with different bases with improved rounding over an entire exponent range with greater accuracy due to proper rounding and minimal storage needed. System 300 may be included on a processor chip, in a software program or may be a functional unit in a processor chip capable of carrying out the operations and functions in accordance with the present principles.

System 300 includes a processing module 302 configured to perform floating point conversion operations. System 300 may be employed to generate a bit vector 304 from test cases and to employ the bit vector 304 for improving future calculations/conversions. This is preferably performed in advance or off-line.

The bit vector 304 is stored in memory 306. The bit vector 304 is configured to store identified exceptional conversions for a given source precision to target precision. The intermediate computational precision includes the source precision, the target precision, and an adjustment due to Continued Fraction theory. The bit vector 304 is employed during the conversion operations to identify when the calculation should be checked for adjusting the rounding rules (e.g., round-up, or round-down).

A hash module 308 is configured to correlate indexes in the bit vector to save storage space in memory. The bit vector correctly identifies the conversion operations when the identified exceptional conversions are encountered. The exceptional conversions may include computations triggering a false indication of exactness or half-exactness.

Conversion of any source and target base combination may be implemented in accordance with the present principles. For purposes of illustration binary and decimal bases will be employed.

During conversion operation, a binary input (source) is provided in the form of: $B*2**b$ where B is a p-bit number (e.g., p=53 (source precision)). An output (target) is configured in the form of: $D*10**d$ where D is a q-digit number (e.g., q=17 (target precision)) with: $(D+F)*10**d = B*2**b$ (EQ. 1) where $-1/2 \leq F \leq +1/2$. Here F is a fraction, and is the difference between the returned significand D (an integer) and the infinitely precise result.

A multiplier, or sequence of multipliers, are devised by processing device 302 to transform the initial value $B*2**b$ into a new value $(U+V)*10**d$, where U is an integral and V is a fraction. The desired result is $D*10**d$ which is in general not exactly equal to $B*2**b$, the exact mathematical relation would be: $B*2**b = (D+F)*10**d$ where F is a fraction. A rounding rule from block 310 determines B from U (it may be U or U+1 in the simplest case). Processing device 302 checks the computed V against a rounding threshold, knowing a bound, M, (from block 310) on the computational error incurred. If safely away from the threshold, rounding can be performed directly. (This will happen in most cases.) If not the processing device, checks the exponent d (just computed) to separate true-exact from false-exact cases. If a true-exact case is encountered, tie-breaking rules are applied. If a false-exact case is encountered, the exponent is hashed and indexed into the precomputed bit vector 304 to decide whether to round up or down.

Having described preferred embodiments of a system and method for fast correctly-rounding floating-point conversion (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for converting bases of floating point numbers with improved rounding over an entire exponent range, comprising:
    identifying exceptional conversions for a given source precision to target precision, wherein said exceptional conversions indicate when a calculation should be checked for adjusting default rounding rules; and
    storing on a computer-readable storage medium a representation of the exceptional conversions in a bit vector for use during conversion execution; applying rounding rules to the exceptional conversions when encountered.

2. The method as recited in claim 1, wherein identifying exceptional conversions comprises executing a number of test cases, the number being determined by the source and target precisions and by an application of continued fraction theory.

3. The method as recited in claim 1, wherein the bit vector is employed by a hashing technique during a check for rounding ties.

4. The method as recited in claim 1, further comprising identifying the exceptional conversions off-line or in advance of performing the conversion.

5. The method as recited in claim 1, wherein the exceptional conversions include computations triggering a false indication of exactness or half-exactness.

6. The method as recited in claim 1, wherein the floating point bases include two and ten, and the conversion is between binary and decimal.

7. The method as recited in claim 1, wherein identifying exceptional conversions includes selecting a bound, M, related to computational error, such that an indication of false indications of exactness or half-exactness is determined.

8. A computer program product for converting bases of floating point numbers with improved rounding over an entire exponent range comprising a computer-readable storage medium including a computer readable program, wherein the computer readable program when executed on a computer causes the computer to perform the steps of:
    identifying exceptional conversions for a given source precision to target precision, wherein said exceptional conversions indicate when a calculation should be checked for adjusting default rounding rules; and
    storing a representation of the exceptional conversions in a bit vector for use during conversion execution applying rounding rules to the exceptional conversions when encountered.

9. The computer program product as recited in claim 8, wherein identifying exceptional conversions comprises executing a number of test cases, the number being determined by the source and target precisions and by an application of continued fraction theory.

10. The computer program product as recited in claim 8, wherein the bit vector is employed by a hashing technique during a check for rounding ties.

11. The computer program product as recited in claim 8, further comprising identifying the exceptional conversions off-line or in advance of performing the conversion.

12. The computer program product as recited in claim 8, wherein the exceptional conversions include computations triggering a false indication of exactness or half-exactness.

13. The computer program product as recited in claim 8, wherein the floating point bases include two and ten, and the conversion is between binary and decimal.

14. The computer program product as recited in claim 8, wherein identifying exceptional conversions includes selecting a bound, M, related to computational error, such that an indication of false indications of exactness or half-exactness is determined.

15. A system for converting bases of floating point numbers with improved rounding over an entire exponent range, comprising:
 a processing module configured to perform floating point conversion operations; and
 a bit vector stored on a computer-readable storage medium configured to store idents led exceptional conversions for a given source precision to a target precision to correctly round results of the conversion operations when the identified exceptional conversions are encountered, wherein said exceptional conversions indicate when a calculation should be checked for adjusting default rounding rules applying rounding rules to the exceptional conversions when encountered.

16. The system as recited in claim 15, wherein the exceptional conversions include computations triggering a false indication of exactness or half-exactness.

17. The system as recited in claim 16, further comprising a bound, M, related to computational error, and configured to indicate false indications of exactness or half-exactness during conversion computations.

18. The system as recited in claim 15, further comprising a hashing module to index the bit vector to determine an action when a false indication of exactness or half-exactness is encountered.

* * * * *